(12) United States Patent
Fischer et al.

(10) Patent No.: US 12,158,703 B2
(45) Date of Patent: Dec. 3, 2024

(54) METHOD FOR REPRODUCING A TARGET WAVEFRONT OF AN IMAGING OPTICAL PRODUCTION SYSTEM, AND METROLOGY SYSTEM FOR CARRYING OUT THE METHOD

(71) Applicant: Carl Zeiss SMT GmbH, Oberkochen (DE)

(72) Inventors: Lukas Fischer, Schwäbisch Gmünd (DE); Klaus Gwosch, Aalen (DE); Markus Koch, Neu-Ulm (DE); Mario Laengle, Jena (DE); Daniel Pagel, Essingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 99 days.

(21) Appl. No.: 17/969,967

(22) Filed: Oct. 20, 2022

(65) Prior Publication Data
US 2023/0130187 A1  Apr. 27, 2023

(30) Foreign Application Priority Data
Oct. 25, 2021  (DE) .......................... 102021211975.1

(51) Int. Cl.
*G03F 7/00* (2006.01)
(52) U.S. Cl.
CPC ...... *G03F 7/70266* (2013.01); *G03F 7/70308* (2013.01); *G03F 7/706* (2013.01)
(58) Field of Classification Search
CPC .. G03F 7/70266; G03F 7/70308; G03F 7/706; G03F 7/70666; G03F 7/706849;
(Continued)

(56) References Cited

U.S. PATENT DOCUMENTS

| 9,746,784 B2 | 8/2017 | Ye et al. |
| 2006/0197934 A1* | 9/2006 | Yamazoe ................. G03F 1/00 355/71 |

(Continued)

FOREIGN PATENT DOCUMENTS

| CN | 104136999 | 11/2014 | ............... G03F 7/20 |
| DE | 102 20 815 | 11/2003 | ............... G12K 7/00 |

(Continued)

OTHER PUBLICATIONS

The Notification of Grounds for Refusal issued by the Japanese Patent Office for Application No. JP 2022-170360 by Examiner Takumichi Sugawara, dated Sep. 7, 2023 (with English Translation).

(Continued)

*Primary Examiner* — Peter B Kim
(74) *Attorney, Agent, or Firm* — Fish & Richardson P.C.

(57) ABSTRACT

An optical measuring system is used to reproduce a target wavefront of an imaging optical production system when an object is illuminated with illumination light. The optical measuring system comprises an object holder displaceable by actuator means and at least one optical component displaceable by actuator means. Within the scope of the target wavefront reproduction, a starting actuator position set ($X_0$), in which each actuator is assigned a starting actuator position, is initially specified. An expected design wavefront ($W_D$) which approximates the target wavefront and which the optical measuring system produces as a set wavefront is determined. A coarse measurement of a starting wavefront ($W_0$) which the optical measuring system produces as actual wavefront after actually setting the starting actuator position set ($X_0$) is carried out. Then, the object holder is adjusted by actuator means until a coarse target wavefront ($W_1$) is obtained for a coarse actuator position set ($X_1$) in the case of a minimum wavefront deviation between the actual wavefront and the design wavefront ($W_D$). Said (Continued)

coarse target wavefront is then subjected to a fine measurement and the at least one optical component is displaced until a fine target wavefront ($W_2$) is obtained for a fine actuator position set ($X_2$) in the case of a minimum deviation between the actual wavefront setting-in in that case and the design wavefront ($W_D$). This reproduction method allows wavefront deviations of the optical measuring system generated by way of targeted misalignment to provide a good approximation of corresponding deviations of the optical production system.

20 Claims, 6 Drawing Sheets

(58) Field of Classification Search
CPC ... G03F 1/84; G01N 21/84; G01N 2021/1765
See application file for complete search history.

(56) References Cited

U.S. PATENT DOCUMENTS

| | | | |
|---|---|---|---|
| 2011/0181855 A1* | 7/2011 | Bittner | G03F 7/70525 |
| | | | 355/55 |
| 2013/0017475 A1 | 1/2013 | Terasawa et al. | |
| 2013/0063716 A1 | 3/2013 | Mann et al. | |
| 2013/0083321 A1 | 4/2013 | Wack et al. | |
| 2015/0362438 A1 | 12/2015 | Mann | |
| 2017/0131528 A1 | 5/2017 | Ruoff et al. | |
| 2017/0132782 A1 | 5/2017 | Matejka et al. | |
| 2018/0164207 A1 | 6/2018 | Blumrich et al. | |

FOREIGN PATENT DOCUMENTS

| | | | |
|---|---|---|---|
| DE | 102 20 816 | 11/2003 | ............ G21K 7/00 |
| DE | 102008042356 | 4/2010 | ............ G02B 13/14 |
| DE | 102013219524 | 4/2015 | ............ G01M 11/02 |
| DE | 102017210164 | 8/2017 | ............ G03F 7/20 |
| DE | 102017204619 | 10/2017 | ............ G06F 7/20 |
| DE | 102019206651 | 11/2020 | ............ G01B 11/00 |
| JP | 2013-026253 | 2/2013 | ............ H01L 21/027 |
| JP | 2016-512615 | 4/2016 | ............ G03F 1/84 |
| JP | 2018-120208 | 8/2018 | ............ G03F 1/84 |
| WO | WO 2013/117343 | 8/2013 | ............ G03F 7/20 |
| WO | WO 2015/044362 | 4/2015 | |
| WO | WO 2016/012425 | 1/2016 | ............ G02B 17/08 |
| WO | WO 2016/012426 | 1/2016 | ............ G02B 17/08 |
| WO | WO 2020/225411 | 11/2020 | ............ G03F 1/84 |
| WO | WO-2020225411 A1 * | 11/2020 | ............ G03F 1/84 |

OTHER PUBLICATIONS

The Office Action and Search Report issued by the Taiwan Patent Office for Application No. TW 111140248, dated Dec. 14, 2023 (with English Machine Translation).

Office Action issued by the German Patent Office for Application No. DE 10 2021 211 975.1, dated Sep. 28, 2022 (with English Translation).

Malacara, *Optical Shop Testing*, Third Edition, A John Wiley & Sons, Inc., Publication, pp. 1-862 (2007).

Van Haver, "The Extended Nijboer-Zernike Diffraction Theory and its Applications", Feb. 5, 2010.

* cited by examiner

METHOD FOR REPRODUCING A TARGET WAVEFRONT OF AN IMAGING OPTICAL PRODUCTION SYSTEM, AND METROLOGY SYSTEM FOR CARRYING OUT THE METHOD

CROSS-REFERENCE TO RELATED APPLICATION

The present patent application claims the priority under 35 U.S.C. § 119 from German patent application DE 10 2021 211 975.1, the entire content of which is incorporated herein by reference.

TECHNICAL FIELD

The invention relates to a method for reproducing a target wavefront of an imaging optical production system when an object is illuminated with illumination light using an optical measuring system. The invention further relates to a metrology system for carrying out the method.

BACKGROUND

A metrology system for measuring an aerial image of a lithography mask in three dimensions is known from WO 2016/012425 A2 and WO 2016/012426 A1. A corresponding metrology system and a method for determining an aerial image of a lithography mask in three dimensions are known from DE 10 2019 206 651 A1. DE 10 2013 219 524 A1 describes a device and a method for determining an imaging quality of an optical system, and an optical system. DE 10 2013 219 524 A1 has described a phase retrieval method for determining a wavefront on the basis of the imaging of a pinhole. DE 10 2017 210 164 B4 describes a method for adjusting an imaging behavior of a projection lens, and an adjustment apparatus. A method for compensating lens heating in a projection exposure apparatus is known from U.S. Pat. No. 9,746,784 B2. DE 10 2008 042 356 A1 discloses a projection exposure apparatus comprising an image defect determination device and a controller of a manipulator for manipulating at least one optical element of a lens of the projection exposure apparatus.

SUMMARY

It is an aspect of the present invention to allow, during the reproduction of a target wavefront of an optical production system by way of an optical measuring system, a good approximation of wavefront deviations of the optical measuring system which are generated by way of targeted misalignment to corresponding deviations of the optical production system.

This aspect is achieved according to the invention by a reproduction method having the features specified in claim 1.

The reproduction method can be used for the targeted reproduction or emulation of a target wavefront of the optical production system, but in principle also for correcting wavefront aberrations that occur during a measuring method carried out with the aid of the optical measuring system.

Provided nothing else is mentioned, an actuator displacement refers to a translation and/or a tilt of the respective component displaced by the said actuator. In general, the determined design wavefront of the optical measuring system differs from the target wavefront of the optical production system to be reproduced. The object can be a test structure. The test structure can be a lithography mask.

It was found to be advantageous within the scope of optimizing an adjustment of the optical measuring system for the best possible approximated reproduction of the target wavefront if this optimization is subdivided into a coarse approximation, in which there initially is only an object displacement, and a fine approximation, in which there then is a complete optimization proceeding from the result of the coarse approximation. The determined coarse target wavefront enables a subsequent fine approximation with a faster convergence, and so the reproduction method can be carried out quickly in comparison with the prior art.

A function set expansion according to claim 2 has proven its worth in practice. The following can be used as basis functions for the function set: Zernike polynomials, Bhatia-Wolf polynomials, Bessel functions, solutions to the Laplace equation, orthogonalized, locally distributed, narrow exponential functions and/or Gaussian functions (optionally distributed on a grid), orthogonalized, locally distributed spline polynomials (optionally distributed on a grid) and orthogonalized mixtures of basis functions. By way of example, such an orthogonalization can be implemented using the Gram-Schmidt orthogonalization method (Korn and Korn, "Mathematical Handbook for Scientists and Engineers," McGraw-Hill, 1968; D. Malacara, "Optical Shop Testing," Wiley-Interscience, 1992; http://de.wikipedia.org/wiki/Schmidtsches_Orthonormalisierungsverfahren). By way of example, the limit order can be a fifth order. To the extent Zernike polynomials are used as the function set expansion, then Zernike polynomials of an order $<Z_5$, for example, may be taken into account during the coarse measurement.

An iterative procedure according to claim 3 has proven its worth in practice. For optimization purposes, use can be made of a projection method (error reduction algorithm, Gerchberg-Saxton method, IFTA method) and/or a conventional iterative optimization method (gradient descent, least square, damped least square, genetic search method, simplex, Chambolle-Pock optimization, back propagation method) and/or a direct inversion method (Extended Nijboer Zernike Decomposition (S. Van Haver, "The Extended Nijboer-Zernike Diffraction Theory and its Applications," 2010, http://resolver.tudelft.nl/uuid:8d96ba75-24da-4e31-a750-1bc348155061), database-based method, machine learning method). Iterative optimization algorithms that may be used are also described in DE 10 2013 219 524 B4.

A phase retrieval during the fine approximation according to claim 4 has likewise proven its worth for minimizing the deviation. Algorithms disclosed in DE 10 2013 219 524 B4 may also be used to this end.

The reproduction method has particularly proven its worth when reproducing an anamorphic production system using an isomorphic optical measuring system according to claim 5.

Alternatively, the reproduction method can also be used to reproduce an isomorphic optical production system using an isomorphic optical measuring system according to claim 6. In this context, further degrees of optimization freedom can then be used to obtain a very accurate deviation minimization.

What can be exploited in the case of a method according to claim 7 is that certain parameters of optical systems frequently are very sensitive in relation to individual functions or orders of a function set expansion in the case of a change in their operating conditions, whereas other functions or orders are essentially hardly influenced or remain uninfluenced. Then, the sensitive functions or orders are used for specifying the target wavefront. This may be exactly one sensitive function or order that is used. By way of example, two such functions or orders may also be used. To the extent that an illumination direction, for example, is varied, this can be taken into account by considering Zernike polynomials $Z_5$ and/or $Z_6$ of a Zernike expansion of the wavefront.

These advantages become particularly important in the method according to claim 8. In particular, an actuator for displacing at least one stop in the optical measuring system can be used as the actuator for specifying the illumination setting. Such a stop may be a constituent part of an illumination optical unit of the optical measuring system and/or a constituent part of an imaging optical unit of the optical measuring system.

The advantages of a metrology system according to claim 9 correspond to those that have already been explained above with reference to the reproduction method.

The metrology system may comprise exactly one component actuator or else more than one component actuator. The number of component actuators is regularly less than ten.

A light source according to claim 10 completes the metrology system. Alternatively, the metrology system may also use a light source of an optical production system, that is to say it can be supplied without a dedicated light source in one sellable product form. The light source can be an EUV light source. A DUV or UV light source can also be used.

A method according to claim 8, in particular, can be carried out using a metrology system according to claim 11.

DESCRIPTION OF DRAWINGS

Exemplary embodiments of the invention are explained in more detail below with reference to the drawings, in which.

DETAILED DESCRIPTION

Figure 1:
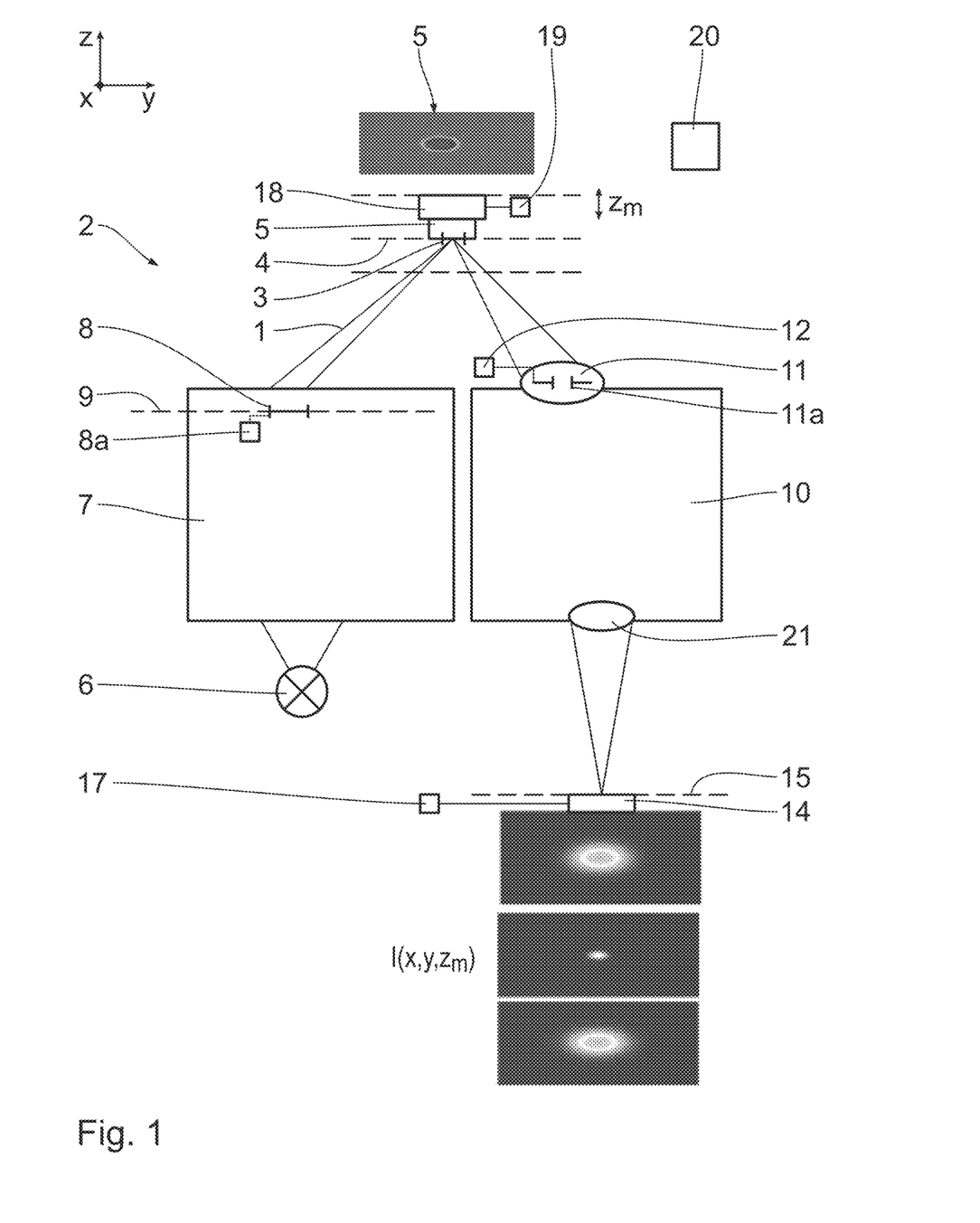
FIG. 1 shows a very schematic plan view, with a viewing direction perpendicular to a plane of incidence, of a metrology system for reproducing a target wavefront of an imaging optical production system when an object is illuminated with illumination light, comprising an illumination optical unit for illuminating the object and an optical measuring system with an imaging optical unit for imaging the object, with the illumination optical unit and the imaging optical unit each being represented very schematically.

In order to facilitate the representation of positional relationships, a Cartesian xyz-coordinate system is used hereinafter. In FIG. 1, the x-axis runs perpendicularly to the plane of the drawing and out of the latter. The y-axis runs towards the right in FIG. 1. In FIG. 1, the z-axis runs upwards.

In a view that corresponds to a meridional section, FIG. 1 shows a beam path of EUV illumination light or imaging light 1 in a metrology system 2 for reproducing a target wavefront of an imaging optical production system when an object is illuminated with the illumination light 1. In an imaging optical unit of an optical measuring system of the metrology system 2, a test structure 5 (cf. FIG. 2) in the form of a reticle or a lithography mask arranged in an object field 3 in an object plane 4 is imaged using the EUV illumination light 1. Below, the test structure 5 is also referred to as object or sample.

The metrology system 2 is used to analyze a three-dimensional (3-D) aerial image (aerial image metrology system). Applications include the reproduction of an aerial image of a lithography mask, as the aerial image would also look in a producing projection exposure apparatus, for example in a scanner. Metrology systems of this type are known from WO 2016/012426 A1, from US 2013/0063716 A1 (cf. FIG. 3 therein), from DE 102 20 815 A1 (cf. FIG. 9 therein), from DE 102 20 816 A1 (cf. FIG. 2 therein) and from US 2013/0083321 A1.

The illumination light 1 is reflected at the object 5. A plane of incidence of the illumination light 1 lies parallel to the yz-plane.

The EUV illumination light 1 is produced by an EUV light source 6. The light source 6 can be a laser plasma source (LPP; laser produced plasma) or a discharge source (DPP; discharge produced plasma). In principle, a synchrotron-based light source may also be used, for example a free electron laser (FEL). A used wavelength of the EUV light source may range between 5 nm and 30 nm. In principle, in the case of a variant of the metrology system 2, a light source for another used light wavelength may also be used instead of the light source 6, for example a light source for a used wavelength of 193 nm.

Depending on the embodiment of the metrology system 2, the latter can be used for a reflective or else for a transmissive object 5. One example of a transmissive object is a pinhole aperture.

An illumination optical unit 7 of the metrology system 2 is arranged between the light source 6 and the object 5. The illumination optical unit 7 serves for the illumination of the object 5 to be examined with a defined illumination intensity distribution over the object field 3 and at the same time with a defined illumination angle distribution with which the field points of the object field 3 are illuminated. This illumination angle distribution is also referred to hereinafter as illumination aperture or illumination setting.

The illumination aperture is delimited by way of a sigma aperture stop 8 of the illumination optical unit 7, which is arranged in an illumination optical unit pupil plane 9. As an alternative or in addition, a corresponding aperture stop may also be present in the imaging optical unit of the metrology system 2, which is yet to be described below. The sigma aperture stop 8 restricts a beam of illumination light 1, which is incident thereon, on the edge. As an alternative or in addition, the sigma aperture stop 8 and/or the stop in the imaging optical unit can also shadow the illumination light beam from the inside, that is to say act as an obscuration stop. A corresponding stop can have an inner stop body that accordingly shadows the beam on the inside, said stop body being connected to an outer stop support body by way of a plurality of webs, for example by way of four webs. The sigma aperture stop 8 is displaceable by way of a displacement drive 8a in the illumination optical unit pupil plane 9, that is to say parallel to the xy-plane, in a defined fashion. The stop displacement drive 8a is an actuator for specifying an illumination setting when illuminating the object 5.

After reflection at the object 5, the illumination or imaging light 1 enters the imaging optical unit or projection optical unit 10 of the optical measuring system of the metrology system 2. In a manner analogous to the illumination aperture, there is a projection optical unit aperture which is specified by an NA aperture stop 11a in an entrance pupil 11 of the projection optical unit 10 in FIG. 1. The NA aperture stop 11a is displaceable by way of a displacement drive 12 in the projection optical unit pupil plane, that is to say parallel to the xy-plane, in a defined fashion. The displacement drive 12 is also an actuator for specifying the illumination setting. Typically, the sigma aperture stop 8 and the NA aperture stop 11a are aligned in such a way relative to one another that both stops are struck centrally by a central light ray of the illumination light 1 and the reflection at the test structure 5. The sigma aperture stop 8 and the NA aperture stop 11a can be centered relative to one another.

The imaging optical unit 10 to be measured serves for imaging the object 5 towards a spatially resolving detection device 14 of the metrology system 2. The detection device 14 is designed for example as a charge-coupled device (CCD) detector. A complementary metal-oxide-semiconductor (CMOS) detector can also be used. The detection device 14 is arranged in an image plane 15 of the projection optical unit 10.

The detection device 14 is signal connected to a digital image processing device 17.

A pixel spatial resolution of the detection device 14 in the xy-plane can be specified in such a way that it is inversely proportional to the numerical aperture of the entrance pupil 11 to be measured, in the coordinate directions x and y ($NA_x$, $NA_y$). In the direction of the x-coordinate, this pixel spatial resolution is regularly less than $\lambda/2NA_x$, and, in the direction of the y-coordinate, it is regularly less than $\lambda/2NA_y$. In this case, $\lambda$ is the wavelength of the illumination light 1. The pixel spatial resolution of the detection device 14 can also be implemented with square pixel dimensions, independently of $NA_x$, $NA_y$.

A spatial resolution of the detection device 14 can be increased or reduced by resampling. A detection device with pixels with different dimensions in the x- and y-direction is also possible.

The object 5 is carried by an object holder or a holder 18. The holder 18 can be displaced by a displacement drive or actuator 19, on the one hand parallel to the xy plane and on the other hand perpendicularly to this plane, that is to say in the z-direction. The displacement drive 19, as also the entire operation of the metrology system 2, is controlled by a central control device 20, which, in a way that is not represented any more specifically, is in signaling connection with the components to be controlled.

The optical structure of the metrology system 2 serves for the most exact possible regeneration or emulation of an illumination and an image representation within the scope of a projection exposure of the object 5 during the projection-lithographic production of semiconductor components. The optical measuring system of the metrology system 2 serves to reproduce the target wavefront of the imaging optical production system of the projection exposure apparatus used in this case.

FIG. 1 shows various possible arrangement planes of the test structure 5 in the region of the object plane 4, in each case using a dashed line. During the operation of the metrology system 2, the test structure 5 is illuminated at different distance positions $z_m$ of the test structure 5 relative to the object plane 4 using the illumination angle distribution respectively specified by the subaperture $10_i$, and an intensity $I(x,y,z_m)$ is recorded in spatially resolved fashion in the image plane 15 for the respective distance position $z_m$. This measurement result $I(x,y,z_m)$ is also referred to as an aerial image.

The number of focal planes $z_m$ can be between two and twenty, for example between ten and fifteen. In this case, there is a total displacement in the z-direction over several Rayleigh units ($NA/\lambda^2$).

Depicted in FIG. 1 as an insert is a xy-plan view of the test structure 5, which may be in the form of a round or an elliptical test structure.

In addition to the entrance pupil 11, FIG. 1 also still schematically represents an exit pupil 21 of the projection optical unit 10. The entrance pupil 11 and the exit pupil 21 of the imaging optical unit 10 both are elliptical.

The imaging optical unit 10 of the metrology system 2 is isomorphic, that is to say it has the same imaging scales in the x- and in the y-direction.

FIG. 1, bottom, shows three measurement results of the detection device 14, once again in a xy-plan view, with the central measurement result showing the image representation of the test structure 5 in the case of an arrangement in the object plane 4 and the other two measurement results showing the image representations in which the test structure 5 has been displaced in comparison with the z-coordinate of the object plane 4, once in the positive z-direction and once in the negative z-direction. An aerial image of the test structure 5 arises from the totality of the measurement results assigned to the respective z-coordinates.

Figure 2:
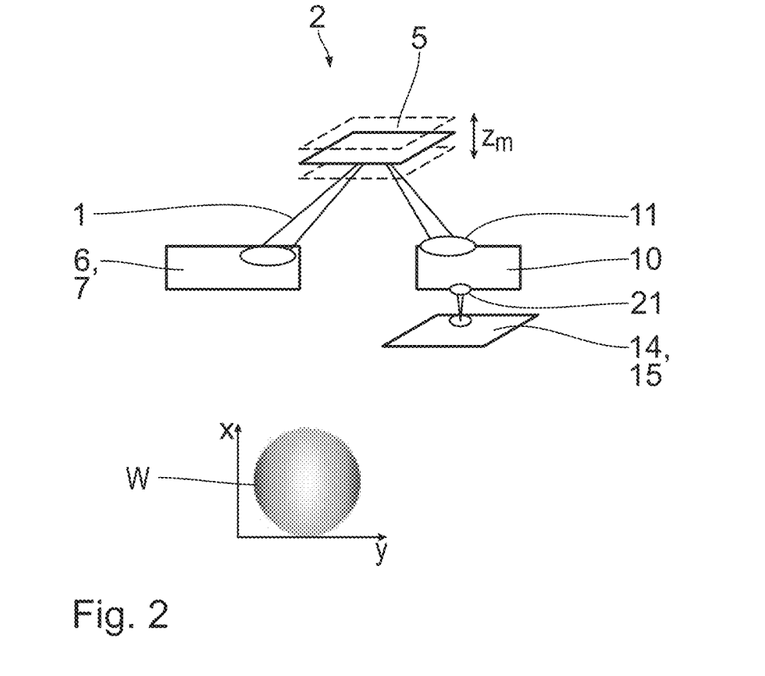
FIG. 2 shows the metrology system according to FIG. 1 even more schematically, with xy-intensity values of an actual wavefront in an image field of the imaging optical unit being depicted in an insert.

FIG. 2 shows the metrology system 2 slightly more schematically than in FIG. 1.

FIG. 2, bottom, depicts an intensity of an actual wavefront of the imaging light 1 in the detection plane of the detection device 14, which may coincide with the image plane 15. Thus, a contour line diagram depicts an intensity distribution I(x, y) in the image plane 15 in the case of a given focus $z_m$ of the object 5 to the object plane.

Figure 3:
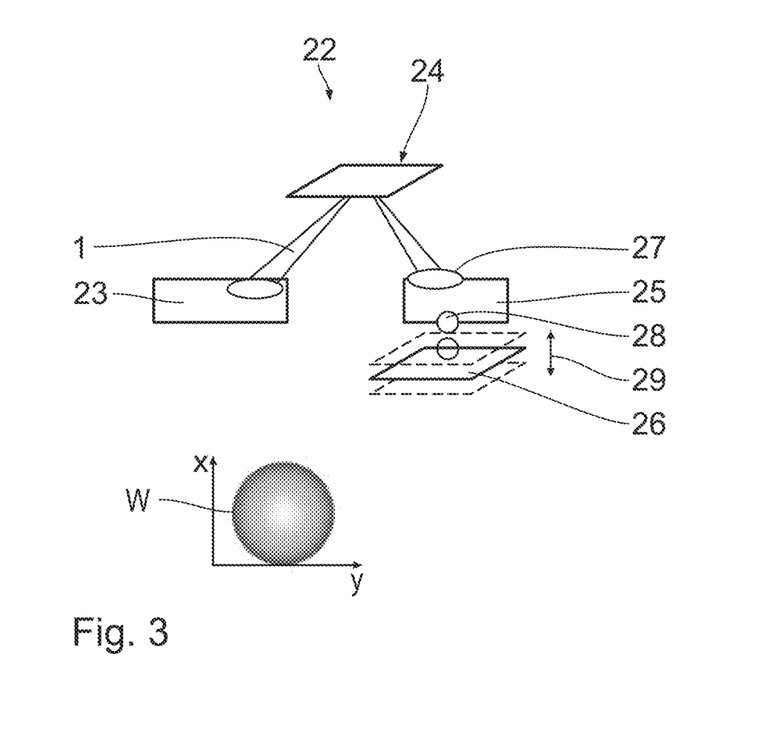
FIG. 3 shows, in an illustration similar to FIG. 2, an optical production system, the intention being to reproduce the target wavefront thereof in the region of an image plane, with this target wavefront likewise being represented in an insert in FIG. 3.

The optical measuring system of the metrology system 2 emulates an optical production system of a projection exposure apparatus 22, which is depicted similarly schematically in FIG. 3 as the metrology system 2 is in FIG. 2.

The projection exposure apparatus 22 comprises a production light source, which is an EUV light source, and a production illumination optical unit 23. A reflective reticle 24, also designated as a lithography mask, is illuminated. Such a reticle 24 may be identical to a test structure 5, but this is not mandatory.

An object field in an object plane of the projection exposure apparatus 22 is imaged into an image field in an image plane 26 by use of an imaging production optical unit 25. Unlike the imaging optical unit 10 of the metrology system 2, the imaging production optical unit 25 of the projection exposure apparatus 22 is anamorphic, that is to say it has different imaging scales in the x- and in the y-direction.

An entrance pupil 27 of the imaging production optical unit 25 is elliptical. An exit pupil 28 of the imaging production optical unit 25 is round.

FIG. 3, bottom, depicts a wavefront W of the imaging light 1, which is guided in the projection exposure apparatus 22, in the region of the image plane 26, once again as an I(x, y) contour line diagram.

When emulating a target wavefront WT of the projection exposure apparatus 22, which could for example be the wavefront W in FIG. 3, bottom, the object 5 is incrementally displaced in the z-direction within the metrology system 2, with the distance positions zm explained above having been assumed in the process. Unlike in the case of the emulation of an isomorphic imaging production optical unit, this z-displacement of the test structure 5 within the metrology system 2 does not lead to the same wavefront change as in the case of a z-displacement of the image plane 26 in the production optical unit 25. This is evident from a comparison of the two wavefronts at the bottom of FIG. 2 (metrology system 2) and at the bottom of FIG. 3 (projection exposure apparatus 22). The elliptical pupils 11, 21 for the imaging optical unit 10 of the metrology system 2 lead to a corresponding elliptic distortion of the wavefront W in the case of a z-displacement of the test structure 5. This also leads to the image of the test structure 5 being imaged in the region of the image plane 15 with different levels of sharpness in the two spatial directions of x on the one hand and y on the other hand.

Figure 4:
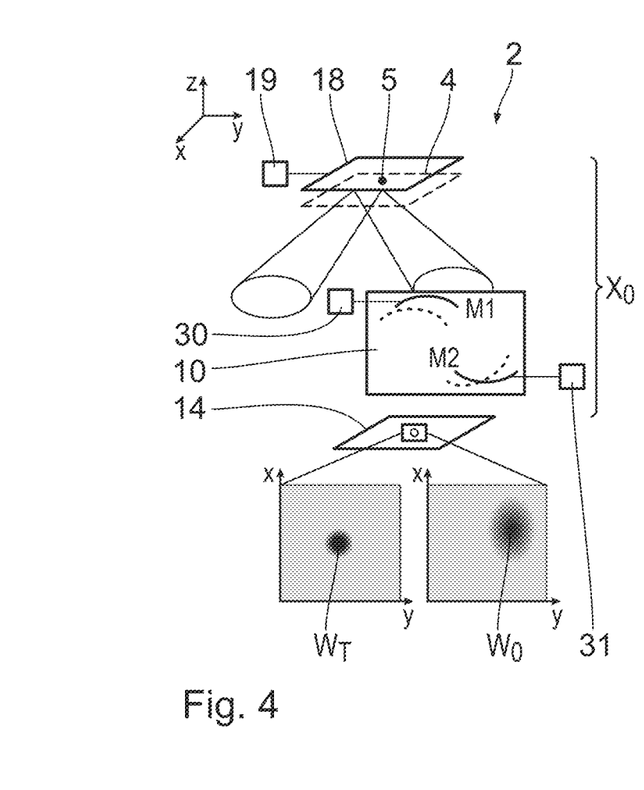
FIG. 4 shows the metrology system in slightly more detail than in FIG. 2, with actuators of an object holder and of two mirrors of the imaging optical unit being set in an initial starting actuator position set, with moreover both a target wavefront of the optical production system which is approximated by a design wavefront of the imaging optical unit of the metrology system representing a set wavefront and a starting wavefront produced by the actuators in the starting actuator position set as actual value being shown in the indicated enlarged details.
Figure 5:
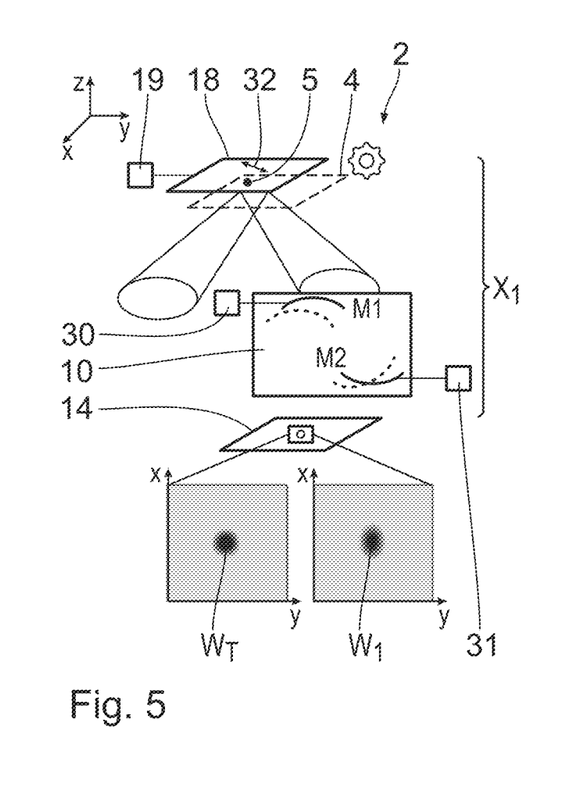
FIG. 5 shows, in an illustration similar to FIG. 4, the metrology system after carrying out a step in which the actual wavefront is coarsely approximated to the design wavefront, with an actuator of an object holder of the metrology system being displaced such that this yields a coarse actuator position set with a coarse target wavefront.
Figure 6:
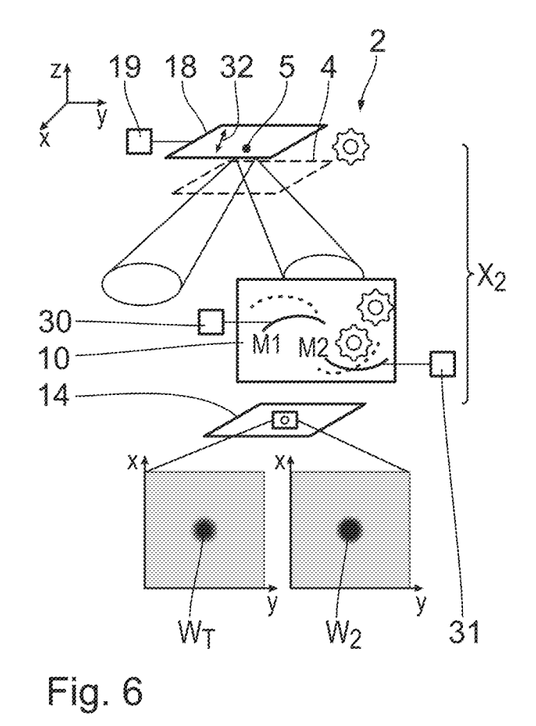
FIG. 6 shows, in an illustration similar to FIGS. 4 and 5, the metrology system after the actual wavefront has been finely approximated to the design wavefront, with a fine actuator position set of the actuators being set.

FIGS. 4 to 6 show instantaneous situations when carrying out a method for reproducing a target wavefront $W_T$ of the imaging production optical unit 25 using the optical measuring system of the metrology system 2 with the imaging optical unit 10, the metrology system 2 in turn being depicted in slightly more detail than in FIG. 2. The specified target wavefront $W_T$ is stored in a memory of the central control device 20.

To emulate a z-displacement of the image plane 26 of the imaging production optical unit 25, the test structure 5 is displaced in the z-direction relative to the object plane 4, which is indicated using dashed lines in FIG. 4. This displacement is implemented with the aid of the displacement drive 19 for the object holder 18. Corresponding to what was already explained above in the context of FIGS. 2 and 3, this displacement leads to a deformation of the actual wavefront W, which is elliptically distorted once again.

The imaging optical unit 10 of the metrology system 2 comprises a plurality of mirrors, of which two mirrors M1, M2 are depicted in FIG. 4. These two mirrors M1, M2 are optical components of the optical measuring system of the metrology system 2. Each of the two mirrors M1, M2 has a component actuator 30, 31 for displacing the respective mirror M1, M2. This displacement can be implemented in terms of at least one translational degree of freedom and/or at least one tilting degree of freedom. The actuators 30, 31 may be designed such that up to five or even up to six displacement degrees of freedom may be used when displacing the mirrors M1, M2.

The actual positions of the mirrors M1, M2 are depicted using solid lines in FIG. 4 and, for the purposes of reproducing a defocused image position of the target wavefront $W_T$, these have deviations from the ideally imaging mirror positions, which are depicted using dashed lines in FIG. 4.

The respective actuator positions of the actuators 30, 31 are combined to form a starting actuator position set $(X_0)$ when carrying out the reproduction method. Such an actuator position set $X_i$ is also referred to as a recipe or displacement recipe. In this starting actuator position set $X_0$, each actuator 30, 31 is assigned a starting actuator position, which is adopted as actual position in FIG. 4.

As is evident from FIG. 4, bottom, the target wavefront $W_T$ and the starting wavefront $W_0$ (cf. FIG. 4, bottom right) of the metrology system 2 deviate significantly from one another.

By determining an actuator position set that deviates from the starting actuator position set $X_0$, it is possible to bring about an adjustment of the components of the imaging optical unit 10, within the scope of which the actual wavefront of the imaging optical unit 10 of the metrology system 2 approximates the target wavefront $W_T$ to a much better extent than in the case of the starting situation according to FIG. 4.

In the reproduction method, finding this actuator position set that optimally approximates the target wavefront $W_T$ is subdivided into a coarse approximation (cf. FIG. 5) on the one hand and a fine approximation (cf. FIG. 6) on the other hand.

Initially, an expected design wavefront $W_D$ which approximates the target wavefront $W_T$ as optimally as possible and which is intended to be produced by the optical measuring system of the metrology system 2 as set wavefront is determined. This design wavefront $W_D$ regularly does not correspond exactly to the target wavefront $W_T$ since unavoidable residual differences remain on account of the different imaging optical units, 10 on the one hand and 25 on the other hand.

Now, a coarse measurement of the starting wavefront $W_0$ is initially carried out within the scope of the coarse approximation of the reproduction method, that is to say a measurement of the wavefront $W_0$ in the situation according to FIG. 4, the starting wavefront being produced by the optical measuring system as actual wavefront following the actual, initial setting of the starting actuator position set $X_0$.

By way of example, the difference between the actual wavefront $W_0$ and the design wavefront $W_D$ emerges from the fact that the simulation of the design wavefront $W_D$ gives rise to deviations in relation to the sensitivities of a displacement influence of the respective actuated components used there, and from the fact that a respective component position specified by the actuator differs from a simulation value when determining the design wavefront $W_D$. Moreover, the installation of the various actuators 19, 30, 31 yields tolerances which may lead to scale errors of individual displacement degrees of freedom and/or to unwanted coupling between different displacement degrees of freedom.

Subsequently, a deviation between an actual wavefront of the optical measuring system emerging from this starting situation, that is to say from the starting wavefront $W_0$, on the one hand and the design wavefront $W_D$ on the other hand is minimized during the coarse approximation only by way of translating the optical holder by way of the displacement drive 19. This translation is indicated in FIG. 5 by a double-headed arrow 32. This minimization is implemented by monitoring, by way of the detection device 14, the actual wavefront W respectively setting-in in the x-, y- and z-position of the test structure 5 on account of the translation 32. The translation of the object holder with the aid of the displacement drive 19 and the corresponding monitoring of the actual wavefront W setting-in in the case of the respective object holder position is implemented by use of the detection device 14 until a coarse target wavefront $W_1$ is obtained in the case of a minimal wavefront deviation for a coarse actuator position set $X_1$ of the actuators 30, 31. This situation is shown in FIG. 5. The test structure 5 has been displaced by the translation 32 in comparison with the position according to FIG. 4. The image position of the actual wavefront W is also matched to the image position of the design wavefront $W_D$ in the x- and the y-direction with the aid of the displacement drive 19.

In the case of the coarse actuator position set $X_1$ according to FIG. 5, the mirrors M1 and M2 are at the same position in comparison with the starting actuator position set $X_0$ according to FIG. 4, that is to say they have not been displaced. In respect of its x/y-position and also in respect of its size and optionally in respect of its x/y-aspect ratio as well, the coarse target wavefront $W_1$ setting-in in accordance with the coarse approximation according to FIG. 5 approximates the target wavefront $W_T$ substantially better than in the case of its start position according to FIG. 4.

The coarse approximation predominantly considers aberrations in the start actuator position according to FIG. 4, which lead to displacement of an image position.

In the image reproduction method, the implemented coarse approximation now is followed by a fine approximation, which is additionally explained on the basis of FIG. 6. In this context, there initially is a fine measurement of the coarse target wavefront $W_1$ which the optical measuring system of the metrology system 2 produces as actual wavefront W after actually setting the coarse actuator position set $X_1$. Subsequently, a deviation between an actual wavefront W, emerging from the coarse target wavefront $W_1$, and the design wavefront $W_D$ is minimized by displacing at least one of the optical components of the imaging optical unit 10, that is to say for example at least one mirror M1, M2. Once again, the actual wavefront W setting-in for the respective component position is monitored here by use of the detection device 14. This is implemented until a fine target wavefront $W_2$ is obtained for a fine actuator position set $X_2$ in the case of the minimal wavefront deviation, said fine target wavefront corresponding to the design wavefront $W_D$ within a specified tolerance.

The design wavefront $W_D$ can be optimized on the basis of a specified metric. The design wavefront $W_D$ can be chosen such that its difference from a target wavefront is minimal in relation to a specific norm. The norm can be an L2 norm, that is to say a norm in the space of square-integrable functions or else a norm in the space of square-summable sequences. Another conceivable method for specifying the design wavefront $W_D$ consists of the minimization in relation to corresponding aerial images. In both cases, it is possible to supply constraints that ensure that the respective reproduction method is implementable, is able to be implemented within a given time, and is afflicted by a small dynamic error.

Limit orders can be chosen such that an optimum can be obtained using a comparatively little complex algorithm while more complicated algorithms can be used for a finer optimization.

The captured actual wavefront W is expanded according to a function set in the coarse measurement. Only orders of the expansion that are smaller than a limit order are considered during the coarse measurement.

Zernike polynomials are an example of such a function set. In the case of the coarse orders, it is then possible, in particular, to take account of deviations between the detected actual wavefront W and the design wavefront $W_D$ at the Zernike orders $Z_2$, $Z_3$ and $Z_4$, that is to say it is possible to consider the deviations $\Delta Z_2$, $\Delta Z_3$, $\Delta Z_4$. Thus, expansion orders that are smaller than the limit order $Z_5$ are taken into account.

Thus, only the low-order image aberrations can be determined and minimized within the scope of the coarse measurement. For the $Z_4$ component, the object 5 can be displaced in the z-direction and the distance to an optimized, best focus can be measured. An image position in the x- and the y-direction can be measured directly by way of the detection device 14 and can be corrected by a corresponding object displacement, in particular in the x- and y-direction.

By way of the respective sensitivity of the Zernike contributions to an absolute object displacement by way of the displacement actuator 19, it is also possible within the scope of the coarse approximation in the reproduction method to deduce the associated coefficients of the various Zernike expansion terms, for example the coefficient for $Z_4$. This is used when determining the coarse actuator position set $X_1$.

For the fine approximation, use can be made of a method known from DE 10 2013 219 524 B4. In this case, a model of the optical measuring system of the metrology system 2 is described in each case, taking account of the respective actuator position set $X_i$. An optical transfer function is then applied thereto in order to produce a simulated image stack, that is to say an aerial image, and hence a modelled wavefront. This modelled wavefront is then compared to the actual wavefront W detected for the respective actuator position set $X_i$. This is subsequently used to determine how the actuator position set is to be modified in order to bring about a reduction in the deviation between the actual wavefront W and the design wavefront $W_D$.

In the process, it is possible to use the optimization and error reduction algorithms that are specified in DE 10 2013 219 524 B4. A phase retrieval method can be used when deducing the wavefront of the optical system. To optimize the determination of the difference, use can be made of a projection method (error reduction algorithm, Gerchberg-Saxton method, IFTA method) and/or a conventional iterative optimization method (gradient descent, least square, damped least square, genetic search method, simplex, Chambolle-Pock optimization, back propagation method) and/or a direct inversion method (Extended Nijboer Zernike Decomposition (S. Van Haver, The Extended Nijboer-Zernike Diffraction Theory and its Applications, 2010, http://resolver.tudelft.nl/uuid:8d96ba75-24da-4e31-a750-1bc348155061), database-based method, machine learning method).

The following can be used as basis functions for the function set expansion: Zernike polynomials, Bhatia-Wolf polynomials, Bessel functions, solutions to the Laplace equation, orthogonalized, locally distributed, narrow exponential functions and/or Gaussian functions (optionally distributed on a grid), orthogonalized, locally distributed spline polynomials (optionally distributed on a grid) and orthogonalized mixtures of basis functions. By way of example, such an orthogonalization can be implemented using the Gram-Schmidt orthogonalization method (Korn and Korn, "Mathematical Handbook for Scientists and Engineers," McGraw-Hill, 1968; D. Malacara, "Optical Shop Testing," Wiley-Interscience, 1992; http://de.wikipedia.org/wiki/Schmidtsches_Orthonormalisierungsverfahren).

The "fine measurement" steps and subsequent deviation minimization within the scope of the fine approximation can be carried out iteratively.

When the reproduction method is carried out, it is possible in particular to reproduce the target wavefront $W_T$ of an anamorphic optical production system using an isomorphic optical measuring system.

Figure 7:
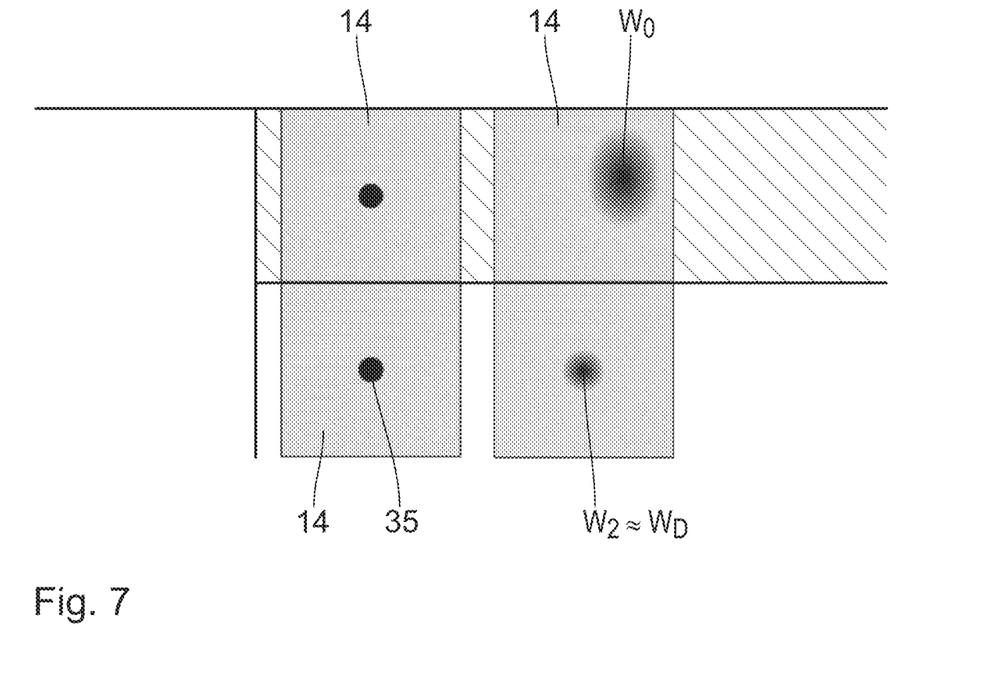
FIG. 7 shows, in the form of a table, a juxtaposition of the effects of a wavefront reproduction of an imaging optical production system with the aid of a metrology system, with the upper line showing the approximation without carrying out the coarse and the fine approximation and the lower line showing the reproduction with carrying out the coarse and the fine approximation step.

FIG. 7 shows a summary of states of the optical measuring system of the metrology system 2, before and after carrying out the reproduction method.

The upper column of FIG. 7 shows the situation prior to the adjustment. Top left depicts the optical measuring system in the case of perfect imaging of the test structure 5 into the arrangement plane of the detection device 14. In this case, the test structure 5 is indicated in circular fashion by way of example. In this case, the components of the metrology system 2 are in the dashed positions of FIGS. 4 to 6. The not yet adjusted situation when setting the starting actuator position set $X_0$ is depicted top right in FIG. 7. This yields the wavefront $W_0$, which can be measured by way of the detection device 14. This wavefront $W_0$ deviates in respect of both the image position and the extent from the target wavefront $W_T$ of the optical production system that would emerge in the case of a z-displacement of the detection plane in the region of the image plane 26.

FIG. 7, bottom left, in turn shows the perfect image representation of the test structure by way of the test structure image 35.

FIG. 7, bottom right, shows the situation when adjusting the fine actuator position set $X_2$. The wavefront $W_2$ obtained corresponds to the design wavefront $W_D$ to a good approximation and likewise corresponds to the target wavefront $W_T$ of the imaging optical production system to a good approximation.

Moreover, the deviations between the fine target wavefront $W_2$ and the design wavefront $W_D$ and the deviations between the fine target wavefront $W_2$ and the target wavefront $W_T$ of the imaging optical production system are also known as a result of the reproduction method since these deviations can be calculated on the basis of the specifications provided within the scope of the reproduction method.

Figure 8:
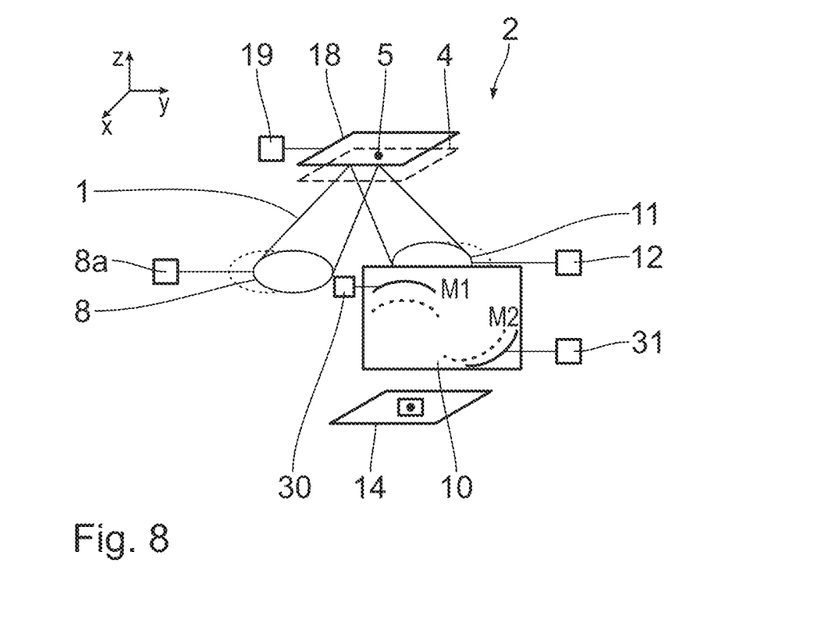
FIG. 8 shows, in an illustration similar to FIG. 4, the metrology system when reproducing a target wavefront of an isomorphic optical production system, with additional specification of the target wavefront and the design wavefront on the basis of an adjustable illumination setting.

FIG. 8 shows a further embodiment of a metrology system 2 in an illustration that is similar to that of FIG. 2. Components and functions which have already been explained above with reference to FIGS. 1 to 7 bear the same reference signs and will not be discussed again in detail.

In the metrology system 2 according to FIG. 8, the actuator positions of the displacement actuators 8a and 12 for the two aperture stops 8 and 11a, which were explained above in conjunction with FIG. 1, are also included in the actuator position set used within the scope of the reproduction method.

In particular, the metrology system 2 according to FIG. 8 can be used to reproduce the target wavefront $W_T$ of an isomorphic optical production system using the isomorphic imaging optical unit 10 of the optical measuring system of the metrology system 2. A wavefront reproduction implemented in the optical production system by displacement of the image position in the z-direction can be implemented in the metrology system 2 by z-displacement of the test structure 5. Different illumination settings, that is to say different illumination directions when illuminating the lithography mask with the optical production system, can be set by way of appropriate illumination angles of the illumination light 1 via the displaceable stops 8, 11a by use of the actuators 8a, 12. Different partial areas of the optical components of the optical measuring system of the metrology system 2 are effective, depending on the illumination angle set. This influences the actual wavefront produced. When disentangling this influence of the illumination angle on the actual wavefront, it was found, for example, that in the case of a Zernike expansion coefficients $Z_5$ and $Z_6$ in particular are very sensitive to the illumination angle, and so greater deviations are expected in the region of these coefficients when there is a change in an illumination angle. These deviations can be corrected by an implementation of the reproduction method described below.

In this case, the wavefront is expanded according to a function set when the target wavefront $W_T$ or the design wavefront $W_D$ is specified, with this specification only taking account of at least one selected order of the expansion, for example the Zernike coefficient $Z_5$, which describes a horizontal-vertical astigmatism.

An illumination setting, that is to say a corresponding illumination angle distribution, for illuminating the test object 5 is specified by way of the setting of the actuators 8a and 12 before the starting actuator position set $X_0$ is specified and before the design waveform $W_D$ is determined. Then, the target wavefront $W_T$ and the design wavefront $W_D$ are specified on the basis of this selected illumination setting.

Actuator position sets $X_i$ which produce a horizontal-vertical astigmatism, that is to say are sensitive to the Zernike coefficient $Z_5$, are determined on the basis of simulated sensitivities of the effect of the actuators, in particular the actuators 30, 31, on the position and the design of the wavefront W. In this case, the specified design wavefront $W_D$ is only dominated by the Zernike coefficient $Z_5$, and the following applies: $W_D \neq W_T$.

The design wavefront $W_D$ is then used to carry out the coarse approximation and the fine approximation, as have already been explained above in conjunction with the FIGS. 4 to 6. There is a correction of low Zernike orders $\Delta Z_2$, $\Delta Z_3$, $\Delta Z_4$ during the coarse approximation. The higher Zernike orders are once again corrected during the fine approximation.

Figure 9:
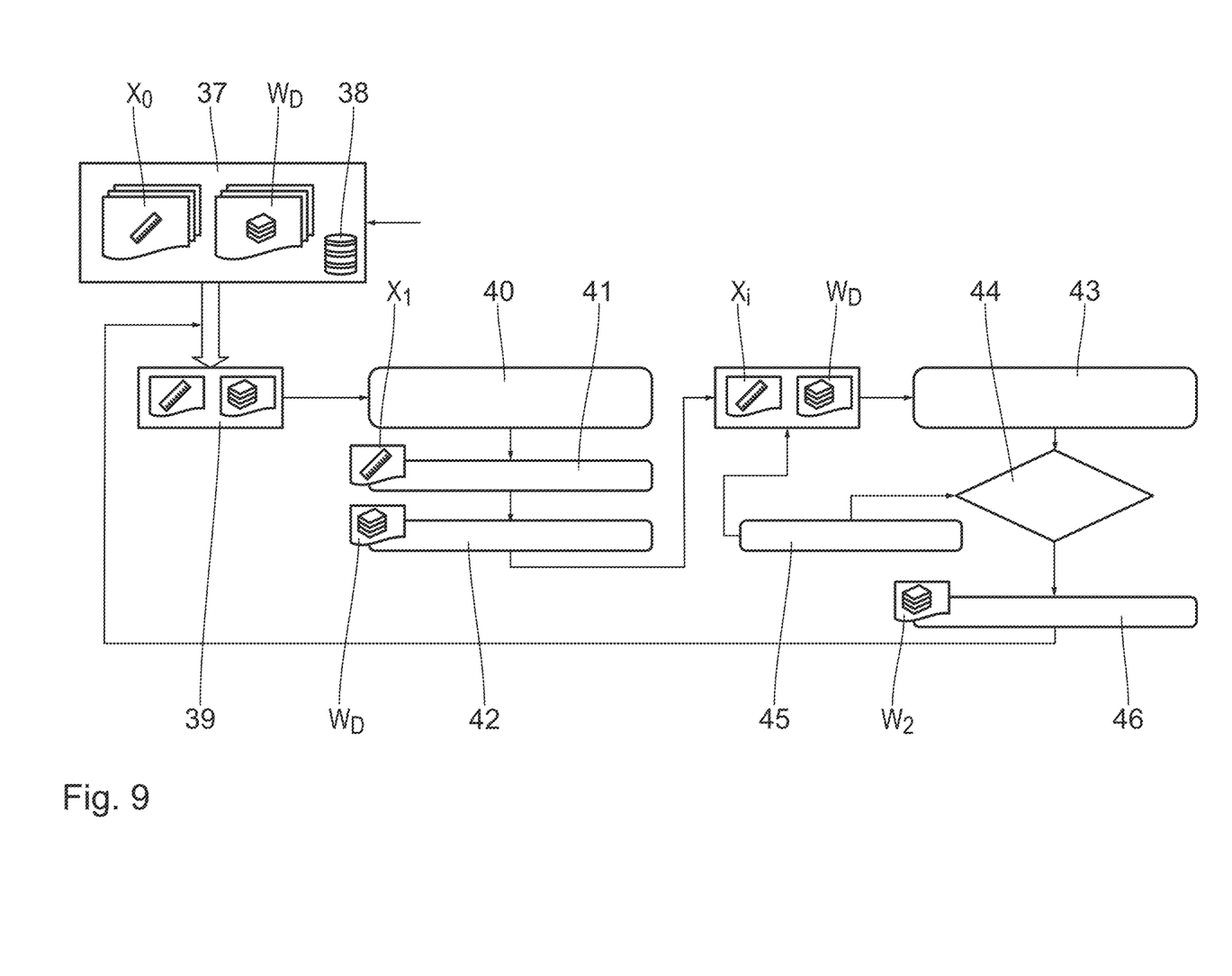
FIG. 9 shows a flowchart of a method for reproducing a target wavefront of an imaging optical production system when an object is illuminated with illumination light using an optical measuring system of the metrology system according to FIGS. 1, 2, 4 and 8.

FIG. 9 shows a flowchart of the reproduction method. A prescription recipe 37 with the starting actuator position set $X_0$ and the design wavefront $W_D$ emerges within the scope of an initialization, which includes the specification of the starting actuator position set $X_0$ and the determination of the design wavefront $W_D$. This information is stored in a memory 38 of the central control device 20.

Within the scope of the coarse approximation, the following is now carried out for each supporting point 39, which is given by a distance position $z_m$. The wavefront data are updated by use of a coarse measurement 40 of the actual wavefront W, proceeding from the start wavefront $W_0$ and by way of carrying out an actuator correction step 41 and a subsequent wavefront measurement 42. The coarse approximation yields the coarse actuator position set $X_1$ and the coarse target wavefront $W_1$.

Now, the fine approximation is carried out iteratively. What is carried out here, in turn, is the fine measurement 43 of the respective actual wavefront and the determination of a deviation between the actual wavefront W and the design wavefront $W_D$ in a comparison step 44, proceeding from the respective actuator position set $X_i$ and the design wavefront $W_D$. The actuator position set is corrected within the scope of a correction step 45 for as long as the deviations between the actual wavefront W and the design wavefront $W_D$ are still too large, that is to say greater than a given tolerance value. This then serves again as a start for the next fine measurement 43. This is carried out until the deviation between the actual wavefront W and the design wavefront $W_D$ in the comparison step 44 is smaller than the given tolerance value. The deviations between the actual wavefront $W_2$ and the design wavefront $W_D$ still arising in this case are stored in a storing step 43 and saved in the central control device 20. Then, especially in the case of a function set expansion, the deviations are available for all orders of the function set, that is to say in particular for all Zernike orders $Z_i$. The procedure is then continued with the next distance position $z_m$.

In addition to the displacement drive 9 of the object holder 18, it is possible, in principle and in particular for correcting an image position, to also actuate other actuators of the optical measuring system of the metrology system 2, in particular actuators of the imaging optical unit 10, while the coarse approximation is carried out.

To the extent that the effect of the described actuators on the wavefront W is linear, it is already possible to use qualified recipes $X_i$, that is to say actuator position sets, in order to keep imaging deviations small during the measurements carried out by use of the metrology system 2. It is possible to determine the difference between the current measurement situation and the stored wavefront of the respective actuator position set $X_i$ and use this to improve the recipe.

The determined fine actuator position sets $X_2$ for the various distance positions $z_m$ can then be used for aerial image determination on the basis of for example a method according to DE 10 2019 206 651 A1.

When correcting thermal drifts in optical systems which are caused by the mask or other optical components (mirrors/lens elements) heating up (cf., e.g., U.S. Pat. No. 9,746,784 B2), the used displacement range is of the order of a few micrometers, or in the single-digit percentage range of the available travel of the manipulators. Scale errors are not important here, which is why an additional qualification of the set aberrations is not essential. By contrast, use is made of up to 30% of an entire manipulator range in order to emulate the defocus of the anamorphic scanner. The travel used in this way in the case of the recipes $X_i$ is 1 to 2 orders of magnitude greater than in the case of corrections that only compensate thermal drift, and for example is in the range between 10 μm and 500 μm.

Such recipes $X_i$ may be stored in a lookup table such that it is possible to verify in each case whether an actuator position set $X_i$ with an associated fitting wavefront W is already available for the reproduction of a target wavefront.

In some implementations, the various computations and/or processing of data (e.g., wavefront data) described in this document can be carried out by the central control device 20, which can include one or more computers, according to the principles described above. For example, determining an expected design wavefront ($W_D$) which approximates the target wavefront ($W_T$) and which the optical measuring system produces as a set wavefront, expanding the wavefront according to a function set (e.g., Zernike polynomials), carrying out a phase retrieval, processing wavefront data as part of minimizing the deviation between an actual wavefront of the optical measuring system emerging from the starting wavefront $W_0$ and the design wavefront $W_D$, processing wavefront data as part of minimizing the deviation between an actual wavefront W, emerging from the coarse target wavefront $W_1$, and the design wavefront $W_D$, carrying out optimization and error reduction algorithms, carrying out a projection method and/or a conventional iterative optimization method, can be implemented by one or more computers according to the principles described above. For example, the central control device 20 can process the wavefront data and determine adjustments for the actuators for displacing the object holder and/or specifying illumination settings (e.g., displacing stops and/or mirrors) in order to minimize the deviation between the measured wavefront and the design wavefront. In some examples, the processing of data can be performed by one or more cloud computer servers. The one or more computers can include one or more data processors for processing data, one or more storage devices for storing data, such as one or more databases, and/or one or more computer programs including instructions that when executed by the one or more data processors cause the one or more data processors to carry out the processes. The central control device 20 can include one or more input devices, such as a keyboard, a mouse, a touchpad, and/or a voice command input module, and one or more output devices, such as a display, and/or an audio speaker. The central control device 20 can show graphical user interfaces on the display to assist the user.

In some implementations, the central control device 20 can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the central control device 20 can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processing of data described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, Blu-ray disc, or solid state drive, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations may be described in a particular order, this should not be understood as requiring that such operations be performed in the particular order described or in sequential order, or that all described operations be performed, to achieve desirable results. In certain circumstances, multitasking and parallel processing may be advantageous. Moreover, the separation of various system components in the embodiments described above should not be understood as requiring such separation in all embodiments.

Thus, particular embodiments of the invention have been described. Other embodiments are within the scope of the following claims. In addition, the actions recited in the claims can be performed in a different order and still achieve desirable results.

What is claimed is:

1. A method for reproducing a target wavefront ($W_T$) of an imaging optical production system when an object is illuminated with illumination light using an optical measuring system,
the optical measuring system being designed to image the object in an object plane into an image field in an image plane,
the optical measuring system comprising an object holder which serves to hold the object and which can be displaced by translation by use of at least one actuator,
the optical measuring system comprising at least one optical component which can be displaced by use of at least one actuator, including the following steps:
specifying a starting actuator position set ($X_0$), in which each actuator is assigned a starting actuator position,
determining an expected design wavefront ($W_D$) which approximates the target wavefront ($W_T$) and which the optical measuring system produces as a set wavefront,
carrying out a coarse measurement of a starting wavefront ($W_0$) which the optical measuring system produces as actual wavefront (W) after actually setting the starting actuator position set ($X_0$),
minimizing a deviation between an actual wavefront (W) emerging from the starting wavefront ($W_0$) and the design wavefront ($W_D$) by translating the object holder and measuring the respectively resulting actual wavefront (W) at the respective object holder position until a coarse target wavefront ($W_1$) has been obtained for a coarse actuator position set ($X_1$) in the case of a minimal wavefront deviation,
carrying out a fine measurement of the coarse target wavefront ($W_1$) which the optical measuring system produces as actual wavefront (W) after actually setting the coarse actuator position set ($X_1$), and
minimizing a deviation between an actual wavefront (W) emerging from the coarse target wavefront ($W_1$) and the design wavefront ($W_D$) by displacing the at least one optical component and monitoring the respectively resulting actual wavefront (W) at the respective component position until a fine target wavefront ($W_2$) has been obtained for a fine actuator position set ($X_2$) in the case of a minimal wavefront deviation.

2. The method of claim 1, wherein the actual wavefront (W) is expanded according to a function set during the coarse measurement, with only orders of the expansion smaller than a limit order being taken into account during the coarse measurement.

3. The method of claim 2, wherein the steps of the fine measurement and the subsequent minimization of the deviation are carried out iteratively.

4. The method of claim 2, wherein a phase retrieval is carried out when carrying out the fine measurement and the subsequent minimization of the deviation.

5. The method of claim 2, wherein the target wavefront ($W_T$) of an anamorphic optical production system is reproduced using an isomorphic optical measuring system.

6. The method of claim 2, wherein the target wavefront ($W_T$) of an isomorphic optical production system is reproduced using an isomorphic optical measuring system.

7. The method of claim 2, wherein the wavefront is expanded according to a function set when specifying the target wavefront ($W_T$), with only at least one selected order of the expansion being taken into account when specifying the target wavefront.

8. The method of claim 2, wherein an illumination setting for illuminating the object by actuating at least one actuator of the optical measuring system is specified prior to the specification of the starting actuator position set ($X_0$) and the determination of the design wavefront ($W_D$) which has been approximated to the target wavefront ($W_T$), with the target wavefront ($W_T$) and the design wavefront ($W_D$) being specified on the basis of the illumination setting.

9. The method of claim 1, wherein the steps of the fine measurement and the subsequent minimization of the deviation are carried out iteratively.

10. The method of claim 1, wherein a phase retrieval is carried out when carrying out the fine measurement and the subsequent minimization of the deviation.

11. The method of claim 1, wherein the target wavefront ($W_T$) of an anamorphic optical production system is reproduced using an isomorphic optical measuring system.

12. The method of claim 1, wherein the target wavefront ($W_T$) of an isomorphic optical production system is reproduced using an isomorphic optical measuring system.

13. The method of claim 1, wherein the actual wavefront (W) is expanded according to a function set when specifying the target wavefront ($W_T$), with only at least one selected order of the expansion being taken into account when specifying the target wavefront.

14. The method of claim 1, wherein an illumination setting for illuminating the object by actuating at least one actuator of the optical measuring system is specified prior to the specification of the starting actuator position set ($X_0$) and the determination of the design wavefront ($W_D$) which has been approximated to the target wavefront ($W_T$), with the target wavefront ($W_T$) and the design wavefront ($W_D$) being specified on the basis of the illumination setting.

15. A metrology system for carrying out the method of claim 1,
comprising an illumination optical unit for illuminating the object,
comprising an optical measuring system for reproducing the target wavefront ($W_T$),
comprising an object holder with an object holder actuator for displacing the object holder,
comprising at least one optical component of the optical measuring system which has a component actuator for displacing the optical component,
comprising a spatially resolving detection device for wavefront measurement, arranged in the region of an image plane of the optical measuring system, and
comprising a central open-loop/closed-loop control device signal-connected to the actuators.

16. The metrology system of claim 15, comprising a light source for producing the illumination light.

17. The metrology system of claim 16, comprising an actuator for specifying an illumination setting for illuminating the object.

18. The metrology system of claim 15, comprising an actuator for specifying an illumination setting for illuminating the object.

19. The metrology system of claim 15, wherein the wavefront is expanded according to a function set during the coarse measurement, with only orders of the expansion smaller than a limit order being taken into account during the coarse measurement.

20. The metrology system of claim 15, wherein the steps of the fine measurement and the subsequent minimization of the deviation are carried out iteratively.

* * * * *

UNITED STATES PATENT AND TRADEMARK OFFICE
CERTIFICATE OF CORRECTION

PATENT NO. : 12,158,703 B2
APPLICATION NO. : 17/969967
DATED : December 3, 2024
INVENTOR(S) : Lukas Fischer et al.

Page 1 of 1

It is certified that error appears in the above-identified patent and that said Letters Patent is hereby corrected as shown below:

In the Specification

Column 7
Line 32, delete "WT" and insert -- $W_T$ --
Line 36, delete "zm" and insert -- $z_m$ --

Signed and Sealed this
Fourth Day of March, 2025

Coke Morgan Stewart
*Acting Director of the United States Patent and Trademark Office*